United States Patent
Lee et al.

(10) Patent No.: US 12,408,409 B2
(45) Date of Patent: Sep. 2, 2025

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Tzung-Han Lee, Hefei (CN); Chun-Wei Liao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 395 days.

(21) Appl. No.: 18/152,205

(22) Filed: Jan. 10, 2023

(65) Prior Publication Data
US 2023/0163179 A1    May 25, 2023

Related U.S. Application Data

(63) Continuation of application No. PCT/CN2022/074554, filed on Jan. 28, 2022.

(30) Foreign Application Priority Data

Jul. 13, 2021   (CN) .......................... 202110790428.0

(51) Int. Cl.
*H10D 62/13* (2025.01)
*H01L 21/265* (2006.01)
(Continued)

(52) U.S. Cl.
CPC ..... *H10D 64/258* (2025.01); *H01L 21/26513* (2013.01); *H10D 62/151* (2025.01); *H10D 64/01* (2025.01)

(58) Field of Classification Search
CPC .... H10D 64/258; H10D 64/01; H10D 64/021; H10D 64/256; H10D 64/251;
(Continued)

(56) References Cited

U.S. PATENT DOCUMENTS 9,627,214 B2   4/2017   Jagannathan et al.
11,075,270 B2   7/2021   Zhaomeng
(Continued)

FOREIGN PATENT DOCUMENTS

CN   101304047 A   11/2008
CN   105870017 A   8/2016
(Continued)

OTHER PUBLICATIONS

International Search Report cited in PCT/CN2022/074554 mailed Apr. 13, 2022, 10 pages.

*Primary Examiner* — Ajay Ojha
*Assistant Examiner* — Sandra Milena Rodriguez Villanu
(74) *Attorney, Agent, or Firm* — Kilpatrick Townsend & Stockton LLP

(57) ABSTRACT

The present disclosure provides a semiconductor structure and a forming method thereof, including: a gate structure is located on a substrate; a plurality of doped regions, located in the substrate, and located at two sides of the gate structure, the doped region includes a first doped region and a second doped region, a concentration of doped ions in the first doped region is greater than a concentration of doped ions in the second doped region, and the first doped region is far from a sidewall of the gate structure; an electrical contact layer, the electrical contact layer is in contact with a sidewall of the first doped region far from the gate structure, and a top surface of the electrical contact layer is higher than a surface of the substrate; and a dielectric layer, the dielectric layer fills a space between the electrical contact layer and the gate structure.

15 Claims, 7 Drawing Sheets

(51) Int. Cl.
*H10D 64/01* (2025.01)
*H10D 64/23* (2025.01)

(58) Field of Classification Search
CPC .... H10D 62/151; H10D 62/60; H10D 62/235; H10D 62/299; H10D 62/307; H10D 62/10; H10D 62/102; H10D 30/601; H10D 30/021; H10D 30/637; H10D 84/0126; H10B 12/05; H10B 12/30; H01L 23/481; H01L 21/02; H01L 21/0415; H01L 21/046; H01L 21/265; H01L 21/425; H01L 21/76859
See application file for complete search history.

(56) References Cited

U.S. PATENT DOCUMENTS

| | | |
|---|---|---|
| 2018/0350931 A1 | 12/2018 | Chiu et al. |
| 2022/0077286 A1* | 3/2022 | Shioda ................ H10D 30/797 |

FOREIGN PATENT DOCUMENTS

| | | |
|---|---|---|
| CN | 103456640 B | 3/2017 |
| CN | 108305902 B | 4/2019 |
| CN | 112017963 A | 12/2020 |
| CN | 112599606 A | 4/2021 |
| CN | 113517337 A | 10/2021 |

* cited by examiner

SEMICONDUCTOR STRUCTURE AND FORMING METHOD THEREOF

CROSS-REFERENCE TO RELATED APPLICATIONS

The present disclosure is a continuation application of International Patent Application No. PCT/CN2022/074554, filed on Jan. 28, 2022, which claims the priority to Chinese Patent Application 202110790428.0, titled "SEMICONDUCTOR STRUCTURE AND FORMING METHOD THEREOF" and filed with the China National Intellectual Property Administration (CNIPA) on Jul. 13, 2021. The entire contents of International Patent Application No. PCT/CN2022/074554 and Chinese Patent Application 202110790428.0 are incorporated herein by reference.

TECHNICAL FIELD

The present disclosure relates to, but is not limited to, a semiconductor structure and a forming method thereof.

BACKGROUND

As a semiconductor memory device commonly used in a computer, a dynamic random access memory (DRAM) includes many repeated memory cells. Each memory cell usually includes a capacitor and a transistor. The transistor is provided with a gate connected to a word line, a drain connected to a bit line, and a source connected to the capacitor. A voltage signal on the word line can control on or off of the transistor, and then data information stored in the capacitor is read through the bit line, or the data information is written into the capacitor through the bit line for storage.

With the rapid development of integrated circuit technologies, a density of devices in an integrated circuit is increasingly high, and the critical dimension of a semiconductor device is continuously decreased. Particularly, an effective gate length is shortened. Consequently, a short-channel effect leads to a leakage problem of a source/drain region, posing a challenge to the reliability of the devices.

SUMMARY

The present disclosure provides a semiconductor structure and a forming method thereof.

A first aspect of the present disclosure provides a semiconductor structure, including: a substrate; a gate structure, where the gate structure is located on the substrate; a plurality of doped regions, located in the substrate, and located at two sides of the gate structure, where the doped region includes a first doped region and a second doped region, a concentration of doped ions in the first doped region is greater than a concentration of doped ions in the second doped region, and the first doped region is far from a sidewall of the gate structure; an electrical contact layer, where the electrical contact layer is in contact with a sidewall of the first doped region far from the gate structure, and a top surface of the electrical contact layer is higher than a surface of the substrate; and a dielectric layer, where the dielectric layer fills a space between the electrical contact layer and the gate structure.

A second aspect of the present disclosure provides a forming method of a semiconductor structure, including: providing a substrate and a gate structure, where the gate structure is located on the substrate; performing ion implantation on the substrate to form a plurality of doped regions in the substrate, where the doped regions are located at two sides of the gate structure, where the doped region includes a first doped region and a second doped region, a concentration of doped ions in the first doped region is greater than a concentration of doped ions in the second doped region, and the first doped region is far from a sidewall of the gate structure; removing part of the substrate, to form a trench, where the trench exposes a sidewall of the first doped region far from the gate structure; forming an electrical contact layer, where the electrical contact layer fills up the trench and is in contact with the sidewall of the first doped region far from the gate structure, and a top surface of the electrical contact layer is higher than a surface of the substrate; and forming a dielectric layer, where the dielectric layer fills a space between the electrical contact layer and the gate structure.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the reliability of the semiconductor structure in the prior art is insufficient.

Figure 1:
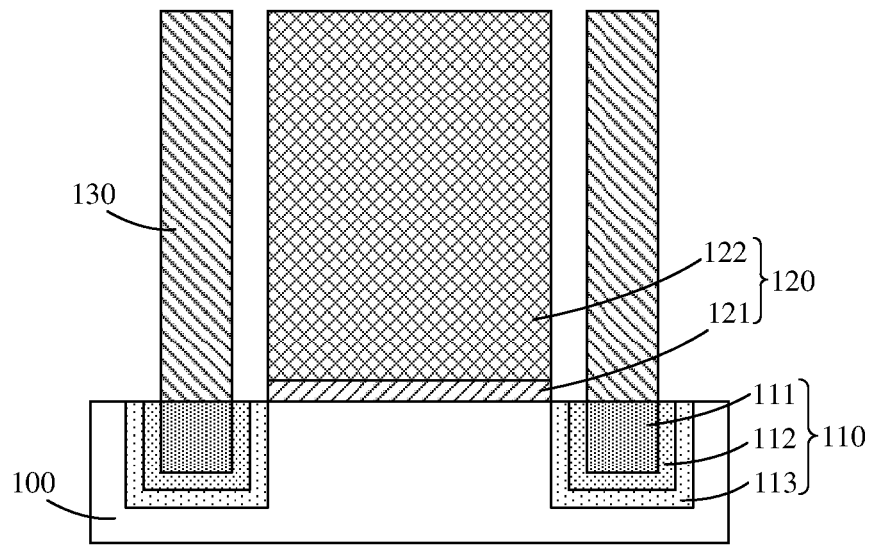
FIG. 1 is a schematic structural diagram of a semiconductor structure.

FIG. 1 is a schematic structural diagram of a semiconductor structure.

Referring to FIG. 1, a semiconductor structure is provided, including: a substrate 100; a gate structure 120, where the gate structure 120 is located on the substrate 100, and the gate structure 120 includes a gate oxide layer 121 and a gate 122; a plurality of doped regions 110, located in the substrate 100, and located at two sides of the gate structure 120, where the doped region 110 includes a first doped region 111, a second doped region 112, and a third doped region 113, a concentration of doped ions in the first doped region 111 is greater than a concentration of doped ions in the second doped region 112 and a concentration of doped ions in the third doped region 113, the second doped region 112 is formed in the third doped region 113, the first doped region 111 is formed in the second doped region 112, and surfaces of the first doped region 111, the second doped region 112, and the third doped region 113 that are close to the substrate 100 are flush with each other; and an electrical contact layer 130, where the electrical contact layer 130 is located on an upper surface of the doped region 110 and is in contact with the first doped region 111.

The doped region 110 may be used as a source or drain of the semiconductor structure. It can be learned from the foregoing that, the doped region 110 has gradient doping distribution, and a doping concentration in a region closer to the surface of the substrate 100 is higher, such that a region with a higher doping concentration is slightly far from the gate structure 120. However, a distance between the gate structure 120 and the region with a higher doping concentration in the source/drain region is still relatively small, and when the gate structure 120 is turned on, the gate structure 120 generates an enhanced electric field in the region, where the enhanced electric field still affects doped ions in the doped region, making the doped region 110 leak a current under the influence of a strong electric field. This manner of only making concentrations of doped ions in the doped region 110 present simple gradient distribution to improve device performance does not meet a requirement of further reduction in a device size, and a current leakage phenomenon in the source/drain region is still serious. In addition, since the subsequently formed electrical contact layer 130 is located on the upper surface of the doped region 110 and is relatively close to the gate structure 120, the gate structure 120 and the electrical contact layer 130 are also easily short circuited.

An embodiment of the present disclosure provides a semiconductor structure, where a concentration of doped ions in a first doped region is greater than a concentration of doped ions in a second doped region, and the first doped region is far from a sidewall of a gate structure, to ensure that most of the doped ions are far from the gate structure. When the gate structure is turned on, the gate structure generates an enhanced electric field in the region. Because the most of the doped ions are far from the gate structure, the enhanced electric field does not affect doped ions in a source/drain region. This is beneficial to avoiding a current leakage risk of the doped region caused by the influence of a strong electric field, and improving performance of the semiconductor structure. In addition, because the electrical contact layer is in contact with a sidewall of the first doped region far from the gate structure, a distance between the electrical contact layer and the gate structure is relatively long. This effectively avoids short circuit caused by a case in which the gate structure is in contact with the electrical contact layer, and is beneficial to improving the reliability of the semiconductor structure.

Figure 2:
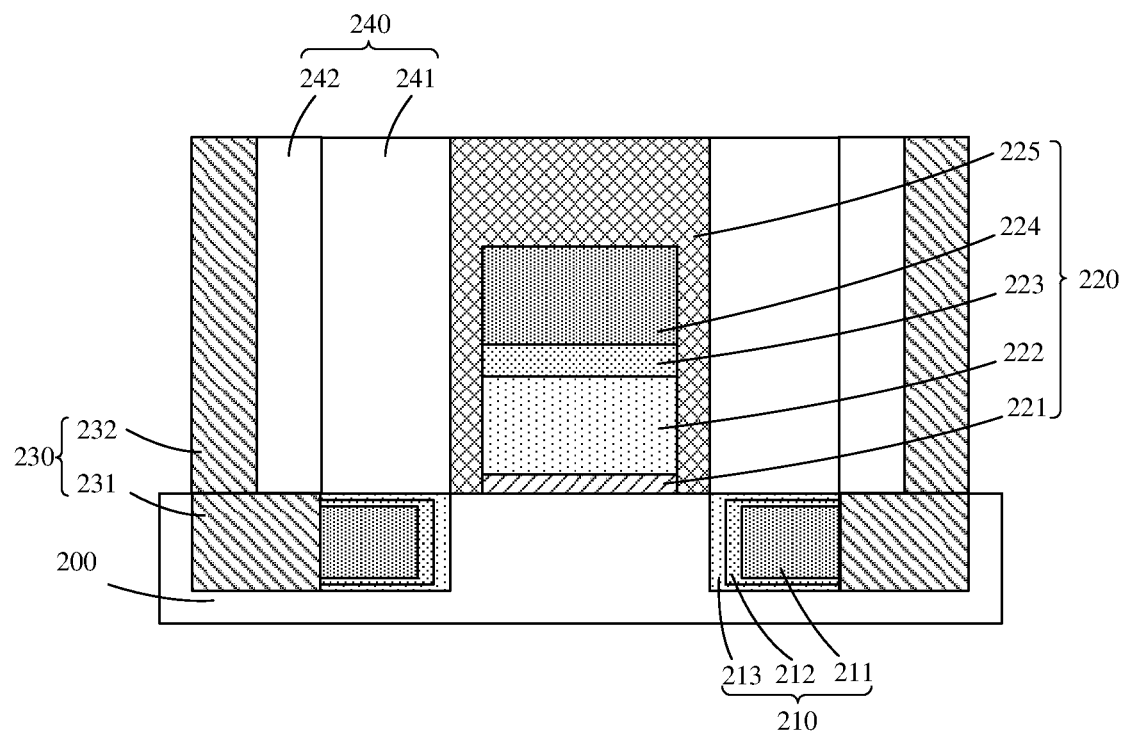
FIG. 2 is a schematic structural diagram of a semiconductor structure according to an embodiment of the present disclosure.

FIG. 2 is a schematic structural diagram of a semiconductor structure according to an embodiment of the present disclosure.

Referring to FIG. 2, a semiconductor structure provided in this embodiment includes: a substrate 200; a gate structure 220, where the gate structure 220 is located on the substrate 200; a plurality of doped regions 210, located in the substrate 200, and located at two sides of the gate structure 220, where the doped region 210 includes a first doped region 211 and a second doped region 212, a concentration of doped ions in the first doped region 211 is greater than a concentration of doped ions in the second doped region 212, and the first doped region 211 is far from a sidewall of the gate structure 220; an electrical contact layer 230, where the electrical contact layer 230 is in contact with a sidewall of the first doped region 211 far from the gate structure 220, and a top surface of the electrical contact layer 230 is higher than a surface of the substrate 200; and a dielectric layer 240, where the dielectric layer 240 fills a space between the electrical contact layer 230 and the gate structure 220.

The substrate 200 is made of a semiconductor material. In this embodiment, the material of the substrate 200 is silicon. In another embodiment, the substrate may be alternatively a germanium substrate, a germanium-silicon substrate, a silicon carbide substrate, or a silicon-on-insulator substrate.

In this embodiment, the gate structure 220 includes a gate oxide layer 221, a first gate conductive layer 222, a gate barrier layer 223, and a second gate conductive layer 224 that are sequentially stacked.

The gate oxide layer 221 is made of an insulating material, for example, silicon dioxide, silicon carbide, or silicon nitride, and is configured to isolate the gate conductive layer from the doped region 210.

In this embodiment, the first gate conductive layer 222 has a relatively low resistance, and a material thereof may be polycrystalline silicon, used to reduce a contact resistance. The gate barrier layer 223 is configured to bar mutual diffusion of the first gate conductive layer 222 and the second gate conductive layer 224, is further configured to increase adhesion between the first gate conductive layer 222 and the second gate conductive layer 224, and a material thereof may be titanium nitride or tantalum nitride. A material of the second gate conductive layer 224 may be tungsten. In another embodiment, the material of the second gate conductive layer may be alternatively another metal material, for example, gold or silver.

The gate structure 220 further includes an isolation structure 225, and the isolation structure 225 is located on a surface of the gate oxide layer 221, a surface of the first gate conductive layer 222, a surface of the gate barrier layer 223, and a surface of the second gate conductive layer 224.

In this embodiment, the isolation structure 225 is a single-layer structure, where a material of the isolation structure 225 is silicon nitride; and is mainly configured to perform isolation and insulation. In another embodiment, the isolation structure may be alternatively a multi-layer structure. The isolation structure 225 has relatively high hardness and a relatively large density and can improve an isolation effect, to avoid a case in which the gate structure 220 is electrically connected to another subsequently formed conductive structure, such that occurrence of problems such as short circuit or current leakage is avoided. In addition, the isolation structure 225 has a relatively good corrosion resistance capability, and therefore can avoid damage during a cleaning process.

The doped region 210 may be an N-type doped region or a P-type doped region. In this embodiment, the doped region 210 is an N-type doped region, the doped region 210 is doped with N-type ions, and the substrate 200 is doped with P-type ions. In another embodiment, the doped region is a P-type doped region, the doped region is doped with P-type ions, and the substrate is doped with N-type ions.

The doped region 210 located on one side of the gate structure 220 is used as a source, and the doped region 210 located on the other side of the gate structure 220 is used as a drain.

In this embodiment, the doped region 210 includes the first doped region 211 and the second doped region 212. A concentration of doped ions in the first doped region 211 is greater than a concentration of doped ions in the second doped region 212, and the first doped region 211 is far from a sidewall of the gate structure 220, to ensure that most of the doped ions are far from the gate structure 220. When the gate structure 220 is turned on, the gate structure 220 generates an enhanced electric field in the region. Because the most of the doped ions are far from the gate structure 220, the enhanced electric field does not affect doped ions in the doped region 210. This is beneficial to avoiding a current leakage risk of the doped region 210 caused by the influence of a strong electric field, and improving performance of the semiconductor structure.

In this embodiment, the doped region 210 further includes a third doped region 213, and a concentration of doped ions in the third doped region 213 is less than the concentration of the doped ions in the second doped region 212.

The first doped region 211 is formed in the second doped region 212, and a sidewall of the second doped region 212 far from the gate structure 220 is flush with the sidewall of the first doped region 211 far from the gate structure 220. It may be understood that, the second doped region 212 is formed in the third doped region 213, and a sidewall of the third doped region 213 far from the gate structure 220 is flush with the sidewall of the second doped region 212 far from the gate structure 220.

When the doped region 210 with this structure is formed, on the basis of ensuring that the most of the doped ions in the doped region 210 are far from the gate structure 220, the third doped region 213 with a lower doping concentration may be first formed in the entire doped region 210, and then doping is performed on preset regions for a plurality of times, to form a doped region with a higher doping concentration. In the process of forming the entire doped region 210, there is no need to worry about a problem of mutual contamination between different doped regions.

Figure 3:
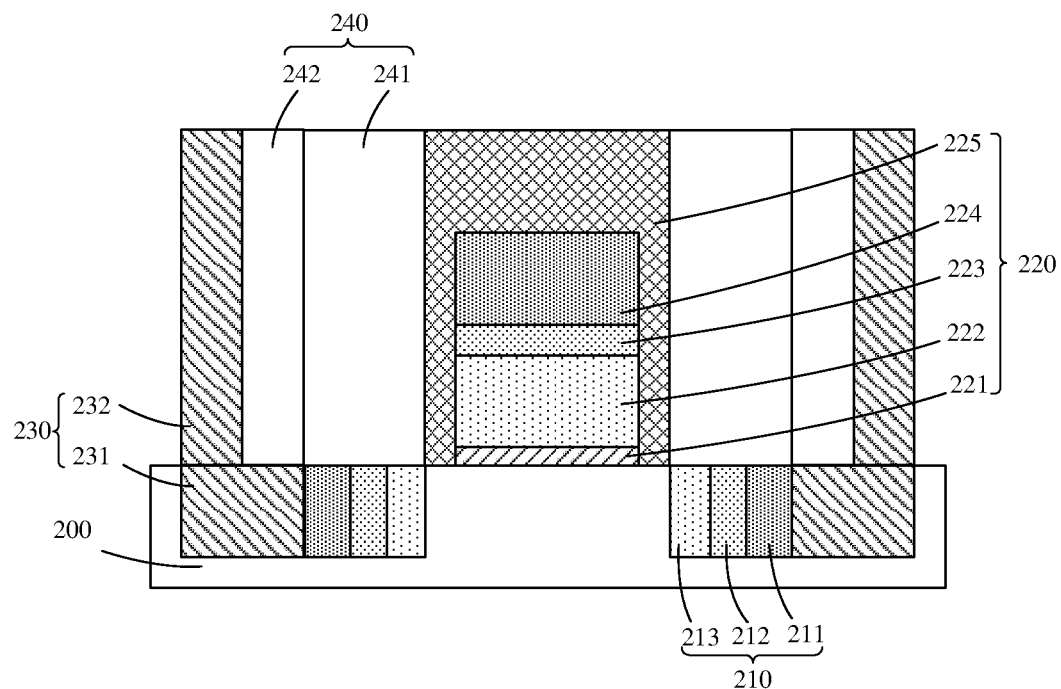
FIG. 3 is another schematic structural diagram of a semiconductor structure according to an embodiment of the present disclosure.

FIG. 3 is another schematic structural diagram of a semiconductor structure according to an embodiment of the present disclosure.

Referring to FIG. 3, in another embodiment, a second doped region 212 and a first doped region 211 are sequentially arranged along a direction far from a sidewall of a gate structure 220. It may be understood that a third doped region 213 is located on a side of the second doped region 212 far from the first doped region 211. Through such arrangement, a distance between a sidewall of the first doped region 211 with a maximum doping concentration close to the gate structure 220 and the gate structure 220 is relatively long. This further avoids a current leakage problem of the doped region 210.

Still referring to FIG. 2, a material of the electrical contact layer 230 is polycrystalline silicon doped with tungsten metal and the like.

Because the electrical contact layer 230 is in contact with the sidewall of the first doped region 211 far from the gate structure 220, a distance between the electrical contact layer 230 and the gate structure 220 is relatively long. In this way, the dielectric layer 240 subsequently formed between the gate structure 220 and the electrical contact layer 230 has a relatively large thickness. This can effectively avoid short circuit caused by a case in which the gate structure 220 is in contact with the electrical contact layer 230, and is beneficial to improving the reliability of the semiconductor structure.

The electrical contact layer 230 includes a first electrical contact layer 231 and a second electrical contact layer 232, where the first electrical contact layer 231 is in contact with the sidewall of the first doped region 211 far from the gate structure 220, and the second electrical contact layer 232 is located on the first electrical contact layer 231. A distance between the second electrical contact layer 232 and the gate structure 220 is greater than a distance between the first electrical contact layer 231 and the gate structure 220 in a direction perpendicular to the sidewall of the gate structure 220.

It can be learned that the second electrical contact layer 232 in the electrical contact layer 230 faces the gate structure 220. In addition, the distance between the second electrical contact layer 232 and the gate structure 220 is greater than the distance between the first electrical contact layer 231 and the gate structure 220. This ensures that the electrical contact layer 230 facing the gate structure 220 has a relatively long distance from the gate structure 220, and is beneficial to avoiding a short circuit risk between the gate structure 220 and the electrical contact layer 230.

In this embodiment, a top surface of the first electrical contact layer 231 is not higher than the surface of the substrate 200; a sidewall of the second electrical contact layer 232 far from the gate structure 220 is flush with a sidewall of the first electrical contact layer 231 far from the gate structure 220, and a width of the second electrical contact layer 232 is shorter than a width of the first electrical contact layer 231 in the direction perpendicular to the sidewall of the gate structure 220.

In this way, a side of the electrical contact layer 230 far from the gate structure 220 is a flat surface. This simplifies a topography of the semiconductor structure, and maximizes the distance between the electrical contact layer 230 and the gate structure 220 on this basis.

In this embodiment, a material of the first electrical contact layer 231 is the same as a material of the second electrical contact layer 232. That the material of the first electrical contact layer 231 is the same as the material of the second electrical contact layer 232 is beneficial to simplifying the step of forming the entire electrical contact layer 230. After an entire initial electrical contact layer is formed, the initial electrical contact layer is etched, to remove part of the initial electrical contact layer, such that the first electrical contact layer 231 and the second electrical contact layer 232 are formed.

In another embodiment, a material of the first electrical contact layer and a material of the second electrical contact layer may be alternatively different. For example, the material of the first electrical contact layer is doped polycrystalline silicon, and the material of the second electrical contact layer is tungsten metal. Because the first electrical contact layer is in contact with the doped region, a contact resistance between the doped polycrystalline silicon and the doped region is relatively small. This is beneficial to improving a conductive effect between the electrical contact layer and the doped region.

Figure 4:
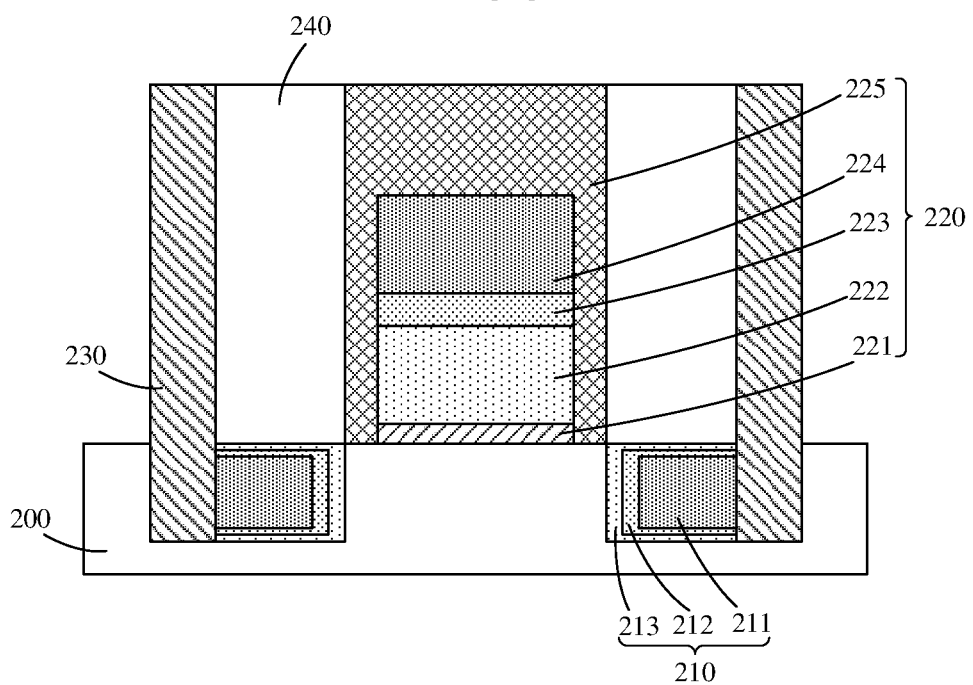
FIG. 4 is still another schematic structural diagram of a semiconductor structure according to an embodiment of the present disclosure.

FIG. 4 is still another schematic structural diagram of a semiconductor structure according to an embodiment of the present disclosure.

Referring to FIG. 4, in another embodiment, a width of an electrical contact layer 230 remains unchanged in a direction perpendicular to a surface of a substrate 200. That is, the electrical contact layer 230 is integral. Through such arrangement, a structure of the electrical contact layer 230 is simple while ensuring that a specific distance exists between the electrical contact layer 230 and the gate structure 220. This simplifies a forming process.

Still referring to FIG. 2, in this embodiment, the first electrical contact layer 231 is in contact with the entire sidewall of the first doped region 211 far from the gate structure 220. In another embodiment, the first electrical contact layer may be alternatively in contact with part of the sidewall of the first doped region far from the gate structure.

In this way, a relatively large contact area exists between the electrical contact layer 230 and the doped region 210. A larger contact area indicates a smaller contact resistance between the electrical contact layer 230 and the doped region 210. This is beneficial to improving a conductive effect between the electrical contact layer 230 and the doped region 210, and further improving performance of the semiconductor structure.

Figure 5:
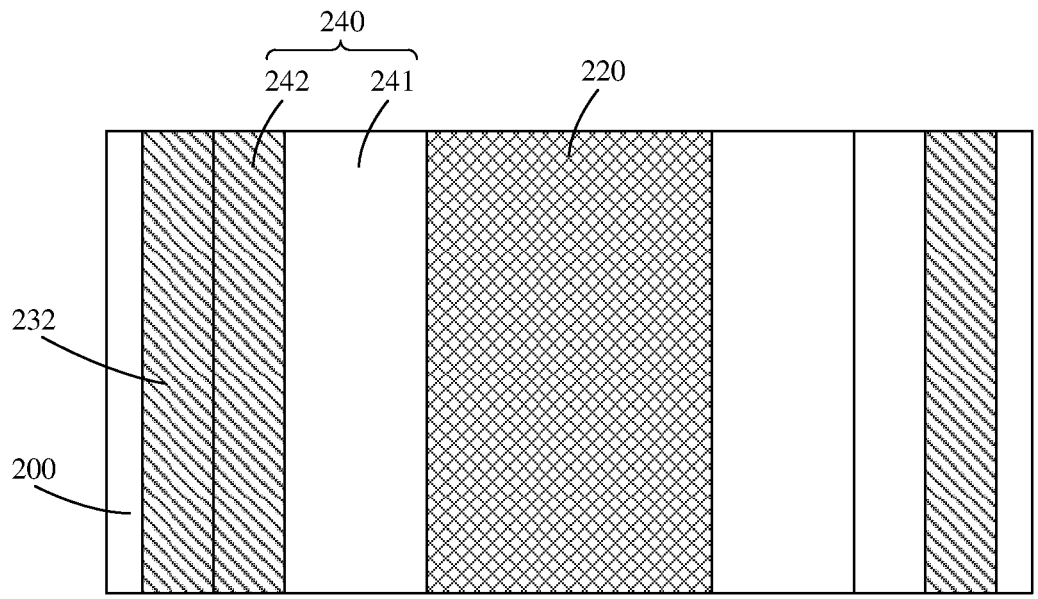
FIG. 5 is a schematic structural top view of a semiconductor structure according to an embodiment of the present disclosure.

FIG. 5 is a schematic structural top view of a semiconductor structure according to an embodiment of the present disclosure.

Referring to FIG. 5, in this embodiment, a length of a second electrical contact layer 232 is equal to a length of a first electrical contact layer 231 (referring to FIG. 2) in an extension direction of a sidewall in a doped region 210 (referring to FIG. 2). In this way, two ends of the first electrical contact layer 231 and two ends of the second electrical contact layer 232 are aligned, and topography of the entire electrical contact layer 230 (referring to FIG. 2) is relatively flat. This simplifies a forming step.

Figure 6:
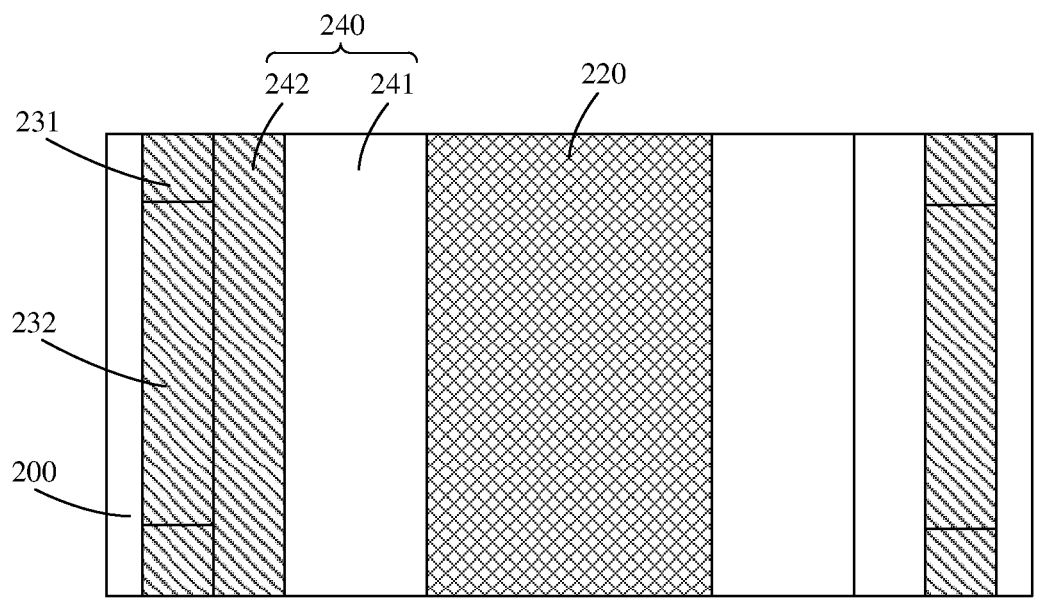
FIG. 6 is another schematic structural top view of a semiconductor structure according to an embodiment of the present disclosure.

FIG. 6 is another schematic structural top view of a semiconductor structure according to an embodiment of the present disclosure.

Referring to FIG. 6, in another embodiment, a length of a second electrical contact layer 232 is shorter than a length of a first electrical contact layer 231 in an extension direction of a sidewall of a doped region 210 (referring to FIG. 2).

Because the first electrical contact layer 231 is in contact with a first doped region 211, the length of the second electrical contact layer 232 is relatively small, and a material of the entire electrical contact layer 230 is reduced while ensuring that a contact area between the entire electrical contact layer 230 and the first doped region 211 remains unchanged. This is beneficial to reducing a volume of the entire semiconductor structure.

In this embodiment, the electrical contact layer 230 may further include a metal semiconductor compound layer, a resistivity of a material of the metal semiconductor compound layer is greater than a resistivity of a material of the first doped region 211, and the metal semiconductor compound layer is in contact with a sidewall of the first doped region 211 far from the gate structure 220.

The material of the metal semiconductor compound layer may be titanium nitride, silicon nitride, or the like; the metal semiconductor compound layer is configured to bar mutual diffusion between the electrical contact layer 230 and the doped region 210 and is further configured to increase adhesion between the electrical contact layer 230 and the doped region 210.

Still referring to FIG. 2, in this embodiment, a material of the dielectric layer 240 may be an insulating material, for example, silicon oxide, silicon carbide, or silicon nitride.

The material of the dielectric layer 240 is the insulating material. Therefore, the dielectric layer 240 located between the gate structure 220 and the electrical contact layer 230 can effectively avoid a case in which the gate structure 220 is electrically connected to the electrical contact layer 230.

In this embodiment, the dielectric layer 240 includes a first dielectric layer 241 and a second dielectric layer 242 that are sequentially arranged along a direction far from the sidewall of the gate structure 220; a sidewall of the first dielectric layer 241 far from the gate structure 220 is flush with the sidewall of the first doped region 211 far from the gate structure 220; and the second dielectric layer 242 is located between the first dielectric layer 241 and the second electrical contact layer 232.

That the sidewall of the first dielectric layer 241 far from the gate structure 220 is flush with the sidewall of the first doped region 211 far from the gate structure 220 means that the first dielectric layer 241 covers an upper surface of the doped region 210. This can ensure that the doped region 210 is not affected when the second electrical contact layer 232 is formed.

In this embodiment, a concentration of doped ions in the first doped region 211 is greater than a concentration of doped ions in the second doped region 212, and the first doped region 211 is far from the sidewall of the gate structure 220, to ensure that most of the doped ions are far from the gate structure 220. When the gate structure 220 is turned on, the gate structure 220 generates an enhanced electric field in the region. Because the most of the doped ions are far from the gate structure 220, the enhanced electric field does not affect doped ions in the doped region 210. This is beneficial to avoiding a current leakage risk of the doped region 210 caused by the influence of a strong electric field, and improving performance of the semiconductor structure. In addition, because the electrical contact layer 230 is in contact with the sidewall of the first doped region 211 far from the gate structure 220, a distance between the electrical contact layer 230 and the gate structure 220 is relatively long. This effectively avoids short circuit caused by a case in which the gate structure 220 is in contact with the electrical contact layer 230, and is beneficial to improving the reliability of the semiconductor structure.

Another embodiment of the present disclosure provides a forming method of a semiconductor structure. The forming method of a semiconductor structure may be used to form the semiconductor structure provided by the foregoing embodiment. The forming method of a semiconductor structure provided by the another embodiment of the present disclosure is described in detail below with reference to the accompanying drawings.

FIG. 7 to FIG. 13 are schematic structural diagrams corresponding to various steps of a forming method of a semiconductor structure according to another embodiment of the present disclosure.

Figure 7:
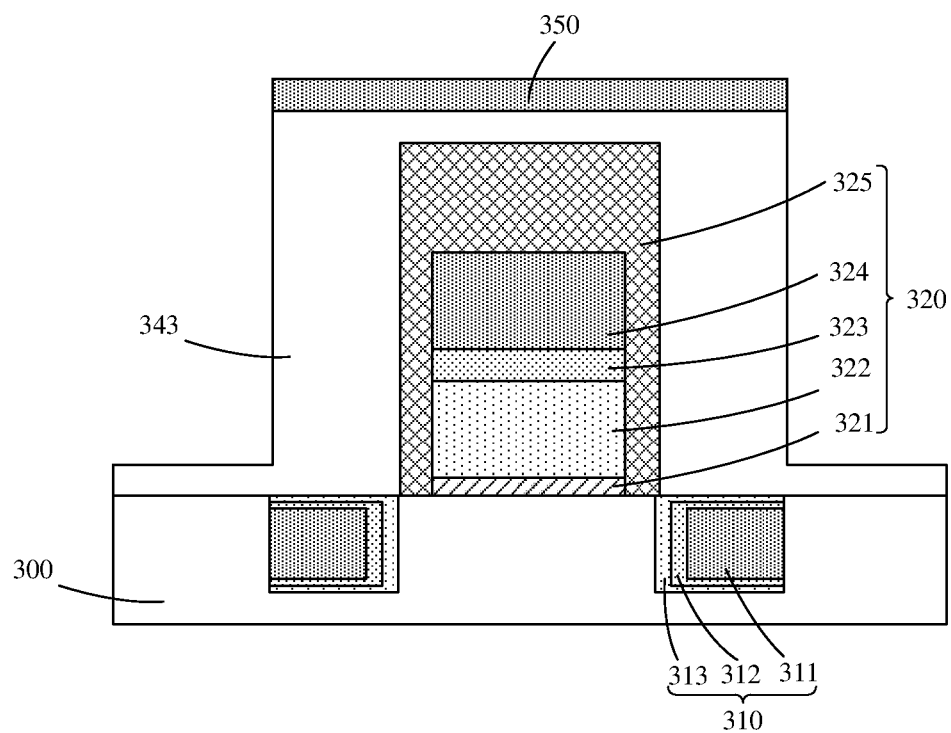
FIG. 7 is a schematic structural diagram of a substrate and a gate structure that are provided in a forming method of a semiconductor structure according to another embodiment of the present disclosure.

Referring to FIG. 7, a substrate 300 and a gate structure 320 are provided, where the gate structure 320 is located on the substrate 300.

The substrate 300 is made of a semiconductor material. In this embodiment, the material of the substrate 300 is silicon. In another embodiment, the substrate may be alternatively a germanium substrate, a germanium-silicon substrate, a silicon carbide substrate, or a silicon-on-insulator substrate.

In this embodiment, the gate structure 320 includes a gate oxide layer 321, a first gate conductive layer 322, a gate barrier layer 323, and a second gate conductive layer 324 that are sequentially stacked.

A material of the gate oxide layer 321 is silicon oxide or a high dielectric material, where the high dielectric material may include one or more of materials $HfO_2$, HfSiO, HfSiON, HfAlO, HfZrO, $Al_2O_3$, $TaO_2$, and the like. The high dielectric material is a material whose relative dielectric constant is greater than a relative dielectric constant of silicon oxide, that is, a high-k material.

In this embodiment, the first gate conductive layer 322 has a relatively low resistance, and a material thereof may be polycrystalline silicon. The gate barrier layer 323 is configured to bar mutual diffusion of the first gate conductive layer 322 and the second gate conductive layer 324, is further configured to increase adhesion between the first gate conductive layer 322 and the second gate conductive layer 324, and a material thereof may be titanium nitride or tantalum nitride. A material of the second gate conductive layer 324 may be tungsten. In another embodiment, the material of the first gate conductive layer may be alternatively another metal material, for example, gold or silver.

The gate structure 320 further includes an isolation structure 325, and the isolation structure 325 is located on a surface of the gate oxide layer 321, a surface of the first gate conductive layer 322, a surface of the gate barrier layer 323, and a surface of the second gate conductive layer 324.

In this embodiment, the isolation structure 325 is a single-layer structure, where a material of the isolation structure 325 is silicon nitride; and is mainly configured to perform isolation and insulation. In another embodiment, the isolation structure may be alternatively a multi-layer structure. The isolation structure 325 has relatively high hardness and a relatively large density and can improve an isolation effect, to avoid a case in which the gate structure 320 is electrically connected to another subsequently formed conductive structure, such that occurrence of problems such as short circuit or current leakage is avoided. In addition, the isolation structure 325 has a relatively good corrosion resistance capability, and therefore can avoid damage during a cleaning process.

Ion implantation is performed on the substrate 300 to form a plurality of doped regions 310 in the substrate 300, where the doped regions 310 are located at two sides of the gate structure 320; the doped region 310 includes a first doped region 311 and a second doped region 312, where a concentration of doped ions in the first doped region 311 is greater than a concentration of doped ions in the second doped region 312; and the first doped region 311 is far from a sidewall of the gate structure 320.

The doped region 310 may be an N-type doped region or a P-type doped region. In this embodiment, the doped region 310 is an N-type doped region, the doped region 310 is doped with N-type ions, and the substrate 300 is doped with P-type ions. In another embodiment, the doped region is a P-type doped region, the doped region is doped with P-type ions, and the substrate is doped with N-type ions.

The doped region 310 located on one side of the gate structure 320 is used as a source, and the doped region 310 located on the other side of the gate structure 320 is used as a drain.

In this embodiment, the doped region 310 includes the first doped region 311 and the second doped region 312. The concentration of the doped ions in the first doped region 311 is greater than the concentration of the doped ions in the second doped region 312, and the first doped region 311 is far from the sidewall of the gate structure 320, to ensure that most of the doped ions are far from the gate structure 320. When the gate structure 320 is turned on, the gate structure 320 generates an enhanced electric field in the region. Because the most of the doped ions are far from the gate structure 320, the enhanced electric field does not affect doped ions in the doped region 310. This is beneficial to avoiding a current leakage risk of the doped region 310 caused by the influence of a strong electric field, and improving performance of the semiconductor structure.

In this embodiment, the formed doped region 310 further includes a third doped region 313, and a concentration of doped ions in the third doped region 313 is less than the concentration of the doped ions in the second doped region 312.

The first doped region 311 is formed in the second doped region 312, and a sidewall of the second doped region 312 far from the gate structure 320 is flush with the sidewall of the first doped region 311 far from the gate structure 320. It may be understood that, the second doped region 312 is formed in the third doped region 313, and a sidewall of the third doped region 313 far from the gate structure 320 is flush with the sidewall of the second doped region 312 far from the gate structure 320.

When the doped region 310 with this structure is formed, on the basis of ensuring that the most of the doped ions in the doped region 310 are far from the gate structure 320, the third doped region 313 with a lower doping concentration may be first formed in the entire doped region 310, and then doping is performed on preset regions for a plurality of times, to form a doped region with a higher doping concentration. In the process of forming the entire doped region 310, there is no need to worry about a problem of mutual contamination between different doped regions.

An initial dielectric layer 343 is formed, where the initial dielectric layer 343 covers a surface of the gate structure 320 and a surface of the substrate 300, and a thickness of the initial dielectric layer 343 located on the sidewall of the gate structure 320 is equal to a width of a top surface of the doped region 310 in a direction perpendicular to the sidewall of the gate structure 320.

The thickness of the initial dielectric layer 343 located on the sidewall of the gate structure 320 is equal to the width of the top surface of the doped region 310, such that a case in which an etching process affects the doped region 310 can be avoided when part of the initial dielectric layer 343 is subsequently removed.

In this embodiment, the initial dielectric layer 343 is formed by using an atomic deposition process. In another embodiment, the initial dielectric layer may be alternatively formed by using a chemical vapor deposition process.

A mask layer 350 is formed on an upper surface of the initial dielectric layer 343 located on an upper surface of the gate structure 320, where the mask layer 350 is a mask used to subsequently remove part of the substrate 300.

Figure 8:
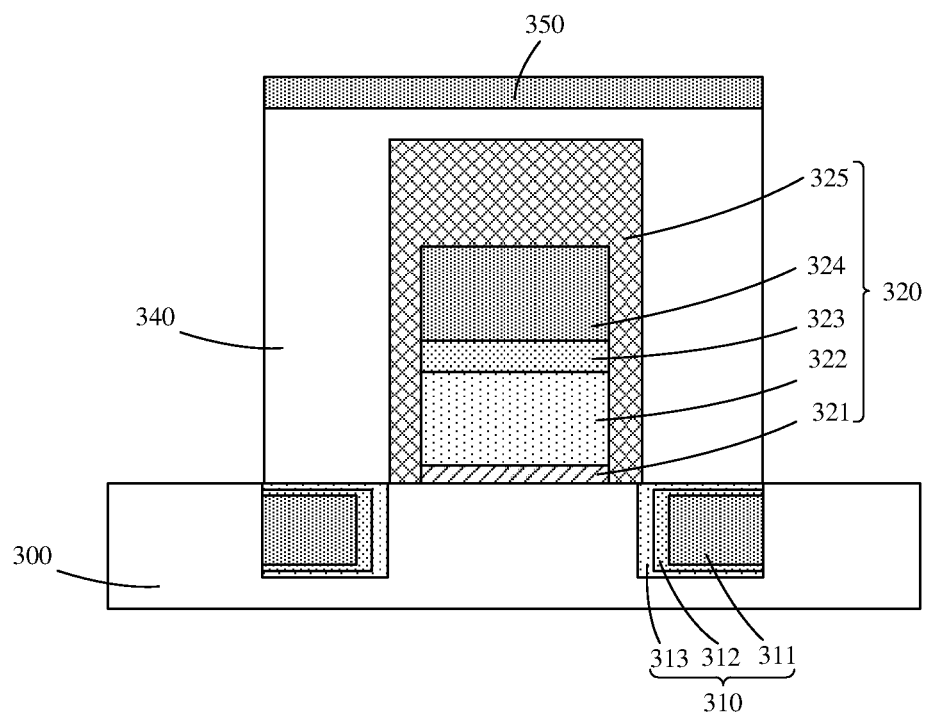
FIG. 8 is a schematic structural diagram obtained after a dielectric layer is formed in the structure shown in FIG. 7.

Referring to FIG. 8, a dielectric layer 340 is formed, where the dielectric layer 340 fills a space between a subsequently formed electrical contact layer and the gate structure 320.

In this embodiment, forming the dielectric layer 340 may be: etching part of the initial dielectric layer 343 (referring to FIG. 7), to expose the surface of the substrate 300, where the remaining part of the initial dielectric layer 343 is used as the dielectric layer 340.

In this embodiment, the part of the initial dielectric layer 343 is removed by using a wet etching process.

A sidewall of the formed dielectric layer 340 far from the gate structure 320 is flush with the sidewall of the first doped region 311 far from the gate structure 320. In this way, when the substrate 300 is subsequently etched by using the dielectric layer 340 and the mask layer 350 as a mask, a formed trench exactly exposes the sidewall of the first doped region 311 far from the gate structure 320.

Figure 9:
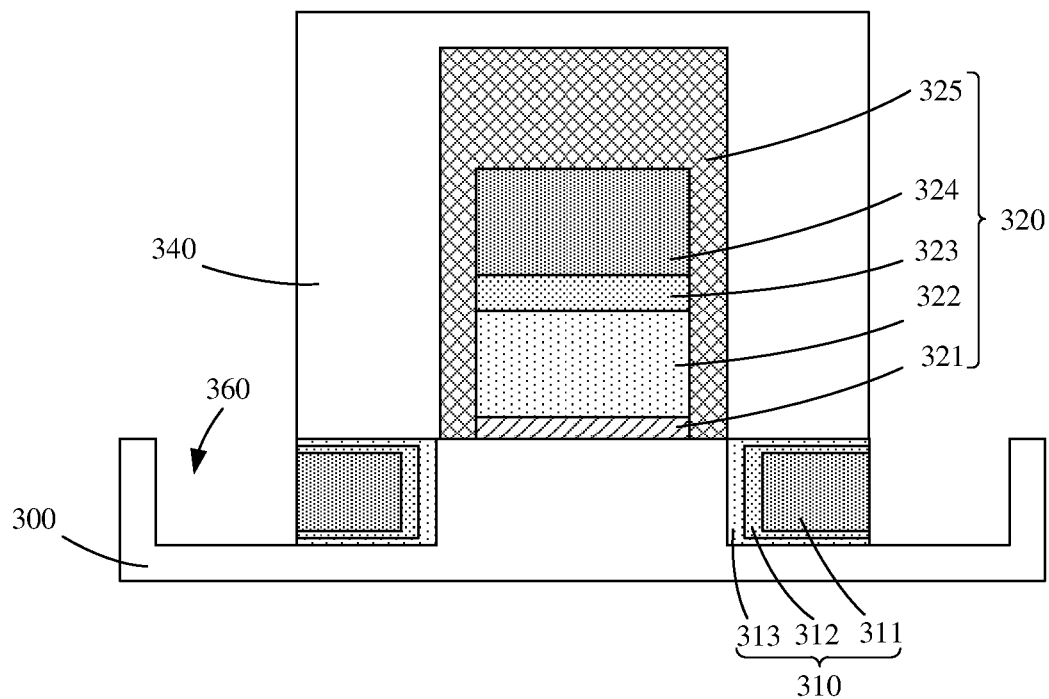
FIG. 9 is a schematic structural diagram obtained after a trench is formed in the structure shown in FIG. 8.

Referring to FIG. 9, part of the substrate 300 is removed, to form a trench 360, where the trench 360 exposes the sidewall of the first doped region 311 far from the gate structure 320.

In this embodiment, the part of the substrate 300 is removed by using the wet etching process, to form the trench 360. In another embodiment, a dry etching process may be alternatively used. The trench 360 exposes the sidewall of the first doped region 311, and a subsequently formed electrical contact layer filling the trench 360 may be in contact with a region with a maximum concentration in the doped region 310. This is beneficial to improving contact performance.

Figure 10:
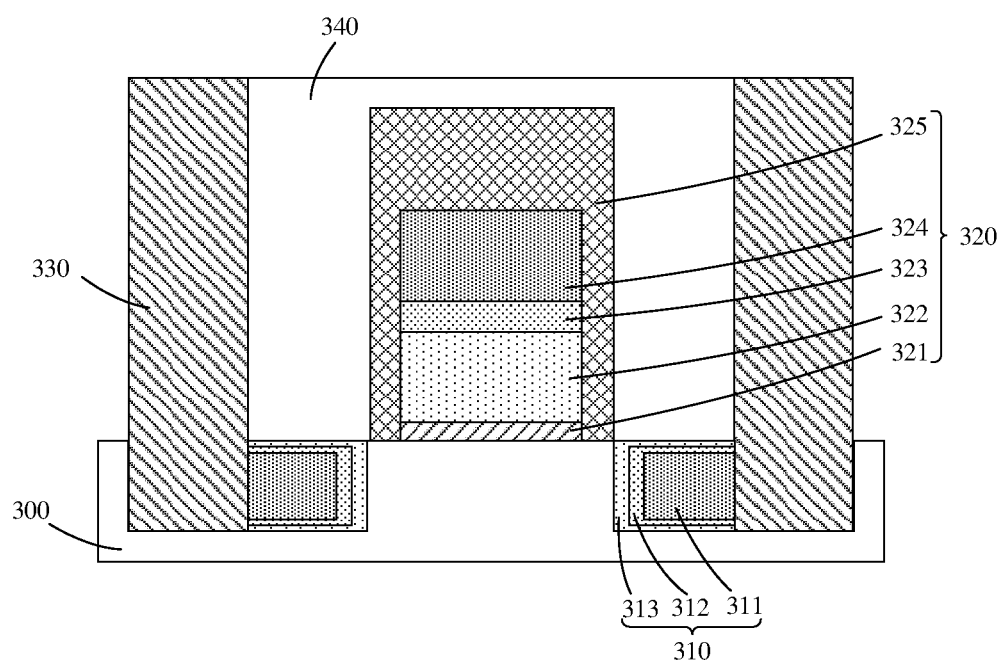
FIG. 10 is a schematic structural diagram obtained after an electrical contact layer is formed in the structure shown in FIG. 9.

Referring to FIG. 10, an electrical contact layer 330 is formed, where the electrical contact layer 330 fills up the trench 360 (referring to FIG. 9) and is in contact with the sidewall of the first doped region 311 far from the gate structure 320, and a top surface of the electrical contact layer 330 is higher than the surface of the substrate 300.

In this embodiment, the formed electrical contact layer 330 may be: The electrical contact layer 330 fills the trench 360 and is located on the sidewall of the dielectric layer 340, and a width of the electrical contact layer 330 in a direction perpendicular to the surface of the substrate 300 remains the same.

Through such arrangement, a structure of the electrical contact layer 330 is simple while ensuring that a specific distance exists between the electrical contact layer 330 and the gate structure 320. This simplifies a forming process.

Figure 11:
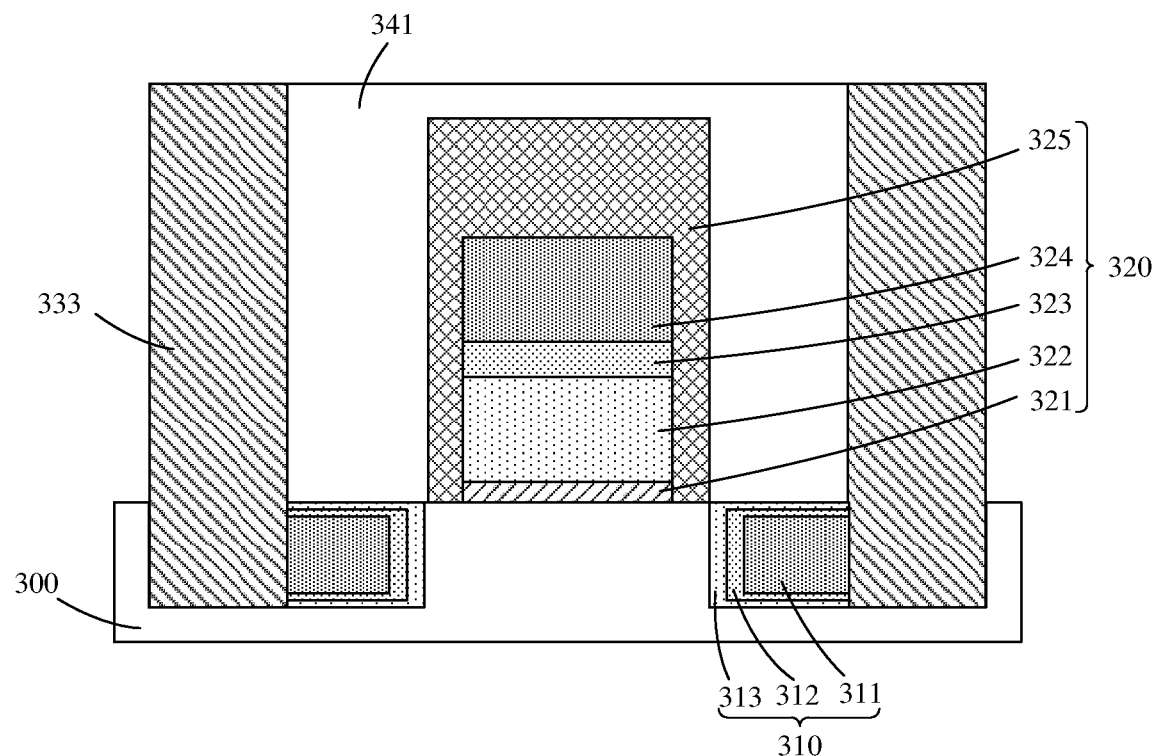
FIG. 11 is a schematic structural diagram obtained after an initial electrical contact layer is formed in a process of forming an electrical contact layer and a dielectric layer according to another embodiment of the present disclosure.

In another example, the step of forming the electrical contact layer 330 and the step of forming the dielectric layer 340 include:

Referring to FIG. 11, a first dielectric layer 341 is formed on the surface of the gate structure 320 after the gate structure 320 is formed, where a sidewall of the first dielectric layer 341 far from the gate structure 320 is flush with the sidewall of the first doped region 311 far from the gate structure 320; an initial electrical contact layer 333 is formed after the trench 360 (referring to FIG. 9) is formed, where the initial electrical contact layer 333 fills up the trench 360, and the initial electrical contact layer 333 is located on a side of the gate structure 320.

Figure 12:
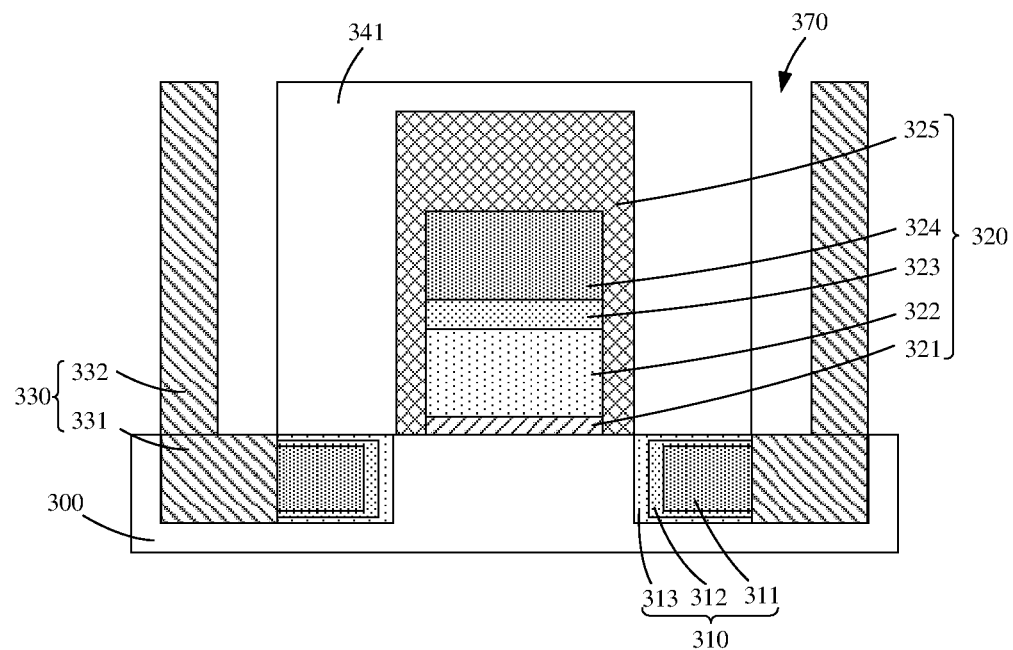
FIG. 12 is a schematic structural diagram obtained after part of an initial electrical contact layer located on a sidewall of a gate structure is removed in the structure shown in FIG. 11.

Referring to FIG. 12, part of the initial electrical contact layer 333 (referring to FIG. 11) located on the sidewall of the gate structure 320 is removed, the remaining part of the initial electrical contact layer 333 is used as the electrical contact layer 330, and a sidewall of the electrical contact layer 330 and the sidewall of the gate structure 320 enclose a groove 370.

The electrical contact layer 330 includes a first electrical contact layer 331 and a second electrical contact layer 332, where the first electrical contact layer 331 is in contact with the sidewall of the first doped region 311 far from the gate structure 320, and the second electrical contact layer 332 is located on the first electrical contact layer 331. A distance between the second electrical contact layer 332 and the gate structure 320 is greater than a distance between the first electrical contact layer 331 and the gate structure 320 in a direction perpendicular to the sidewall of the gate structure 320.

It can be learned that the second electrical contact layer 332 in the electrical contact layer 330 faces the gate structure 320. In addition, the distance between the second electrical contact layer 332 and the gate structure 320 is greater than the distance between the first electrical contact layer 331 and the gate structure 320. This ensures that the electrical contact layer 330 facing the gate structure 320 has a relatively long distance from the gate structure 320, and is beneficial to avoiding a short circuit risk between the gate structure 220 and the electrical contact layer 330.

Figure 13:
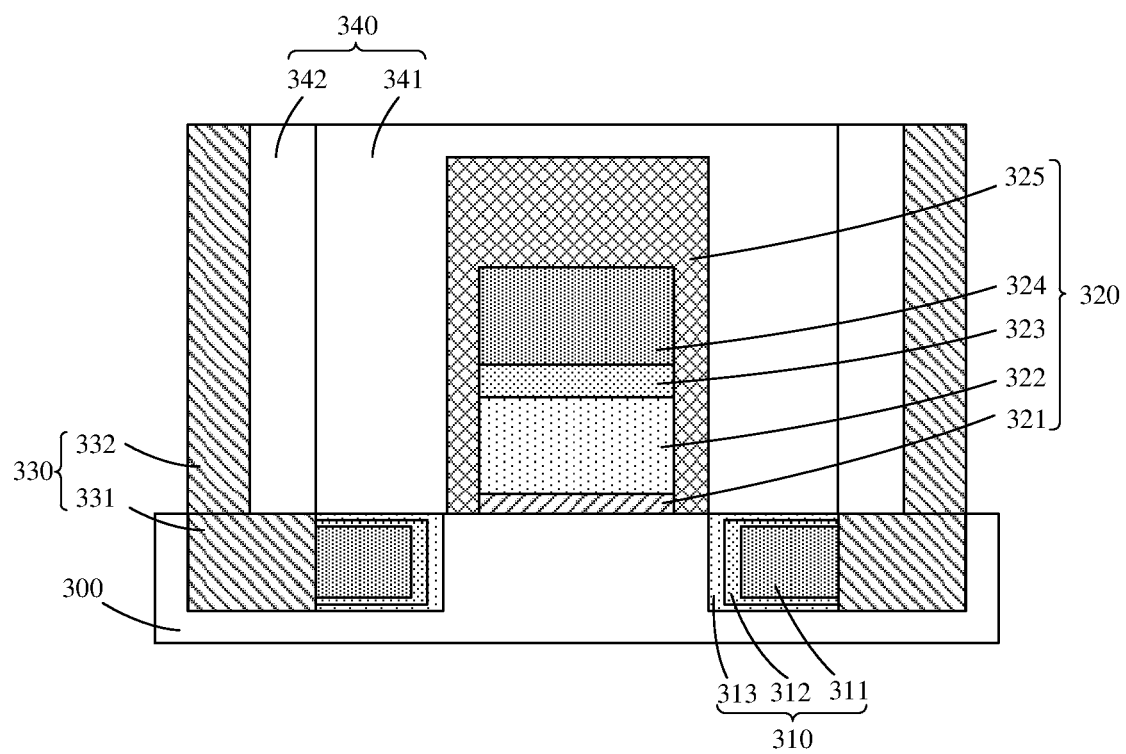
FIG. 13 is a schematic structural diagram obtained after a groove is filled to form a second dielectric layer in the structure shown in FIG. 12.

Referring to FIG. 13, the groove 370 (referring to FIG. 12) is filled, to form a second dielectric layer 342, where the first dielectric layer 341 and the second dielectric layer 342 constitute the dielectric layer 340.

That the sidewall of the first dielectric layer 341 far from the gate structure 320 is flush with the sidewall of the first doped region 311 far from the gate structure 320 means that the first dielectric layer 341 covers an upper surface of the doped region 310. This can ensure that the doped region 310 is not affected when the second electrical contact layer 332 is formed.

In this embodiment, the semiconductor structure is formed, where a concentration of doped ions in the first doped region 311 is greater than a concentration of doped ions in the second doped region 312, and the first doped region 311 is far from the sidewall of the gate structure 320, to ensure that most of the doped ions are far from the gate structure 320. When the gate structure 320 is turned on, the gate structure 320 generates an enhanced electric field in the region. Because the most of the doped ions are far from the gate structure 320, the enhanced electric field does not affect doped ions in the doped region 310. This is beneficial to avoiding a current leakage risk of the doped region 310 caused by the influence of a strong electric field, and improving performance of the semiconductor structure. In addition, because the electrical contact layer 330 is in contact with the sidewall of the first doped region 311 far from the gate structure 320, a distance between the electrical contact layer 330 and the gate structure 320 is relatively long. This effectively avoids short circuit caused by a case in which the gate structure 320 is in contact with the electrical contact layer 330, and is beneficial to improving the reliability of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
   a substrate;
   a gate structure, wherein the gate structure is located on the substrate;
   a plurality of doped regions, located in the substrate, and located at two sides of the gate structure, wherein one of the plurality of doped regions comprises a first doped region and a second doped region, a concentration of doped ions in the first doped region is greater than a concentration of doped ions in the second doped region, and the first doped region is farther from a sidewall of the gate structure than the second doped region;
   an electrical contact layer, wherein the electrical contact layer is in contact with a sidewall of the first doped region far from the gate structure, and a top surface of the electrical contact layer is higher than a surface of the substrate; and
   a dielectric layer, wherein the dielectric layer fills a space between the electrical contact layer and the gate structure.

2. The semiconductor structure according to claim 1, wherein the electrical contact layer comprises a first electrical contact layer and a second electrical contact layer, and the first electrical contact layer is in contact with the sidewall of the first doped region far from the gate structure; and
   the second electrical contact layer is located on the first electrical contact layer, and a distance between the second electrical contact layer and the gate structure is greater than a distance between the first electrical contact layer and the gate structure in a direction perpendicular to the sidewall of the gate structure.

3. The semiconductor structure according to claim 2, wherein a top surface of the first electrical contact layer is not higher than the surface of the substrate; and
   a sidewall of the second electrical contact layer far from the gate structure is flush with a sidewall of the first electrical contact layer far from the gate structure, and a width of the second electrical contact layer is shorter than a width of the first electrical contact layer in the direction perpendicular to the sidewall of the gate structure.

4. The semiconductor structure according to claim 2, wherein the first electrical contact layer is in contact with an entire sidewall of the first doped region far from the gate structure.

5. The semiconductor structure according to claim 2, wherein a length of the second electrical contact layer is shorter than or equal to a length of the first electrical contact layer in an extension direction of a sidewall of the doped region.

6. The semiconductor structure according to claim 2, wherein a material of the first electrical contact layer is the same as a material of the second electrical contact layer.

7. The semiconductor structure according to claim 2, wherein the dielectric layer comprises a first dielectric layer and a second dielectric layer that are sequentially arranged along a direction far from the sidewall of the gate structure;
   a sidewall of the first dielectric layer far from the gate structure is flush with the sidewall of the first doped region far from the gate structure; and
   the second dielectric layer is located between the first dielectric layer and the second electrical contact layer.

8. The semiconductor structure according to claim 1, wherein a width of the electrical contact layer remains unchanged in a direction perpendicular to the surface of the substrate.

9. The semiconductor structure according to claim 1, wherein the second doped region and the first doped region are sequentially arranged along a direction far from the sidewall of the gate structure.

10. The semiconductor structure according to claim 1, wherein the first doped region is formed in the second doped region, and a sidewall of the second doped region far from the gate structure is flush with the sidewall of the first doped region far from the gate structure.

11. The semiconductor structure according to claim 1, wherein the electrical contact layer further comprises a metal semiconductor compound layer, a resistivity of a material of the metal semiconductor compound layer is greater than a resistivity of a material of the first doped region, and the metal semiconductor compound layer is in contact with the sidewall of the first doped region far from the gate structure.

12. A forming method of a semiconductor structure, comprising:

proviiding a substrate and a gate structure, wherein the gate structure is located on the substrate;

performing ion implantation on the substrate to form a plurality of doped regions in the substrate, wherein the doped regions are located at two sides of the gate structure;

wherein one of the plurality of doped regions comprises a first doped region and a second doped region, a concentration of doped ions in the first doped region is greater than a concentration of doped ions in the second doped region, and the first doped region is far farther from a sidewall of the gate structure than the second doped region;

removing part of the substrate, to form a trench, wherein the trench exposes a sidewall of the first doped region far from the gate structure;

forming an electrical contact layer, wherein the electrical contact layer fills up the trench and is in contact with the sidewall of the first doped region far from the gate structure, and a top surface of the electrical contact layer is higher than a surface of the substrate; and forming a dielectric layer, wherein the dielectric layer fills a space between the electrical contact layer and the gate structure.

13. The forming method of a semiconductor structure according to claim 12, wherein the forming the electrical contact layer and the forming the dielectric layer comprise: forming the dielectric layer on a surface of the gate structure after the gate structure is formed, wherein a sidewall of the dielectric layer far from the gate structure is flush with the sidewall of the first doped region far from the gate structure; and forming the electrical contact layer after the trench is formed, wherein the electrical contact layer fills the trench and is located on the sidewall of the dielectric layer, and a width of the electrical contact layer remains the same in a direction perpendicular to the surface of the substrate.

14. The forming method of a semiconductor structure according to claim 13, wherein the forming the dielectric layer comprises: forming an initial dielectric layer, wherein the initial dielectric layer covers the surface of the gate structure and the surface of the substrate, and a thickness of the initial dielectric layer located on the sidewall of the gate structure is equal to a width of a top surface of the doped region in a direction perpendicular to the sidewall of the gate structure; and etching part of the initial dielectric layer before the substrate is etched, to expose the surface of the substrate, wherein the remaining part of the initial dielectric layer is used as the dielectric layer.

15. The forming method of a semiconductor structure according to claim 12, wherein the forming an electrical contact layer and the forming a dielectric layer comprise:

forming a first dielectric layer on a surface of the gate structure after the gate structure is formed, wherein a sidewall of the first dielectric layer far from the gate structure is flush with the sidewall of the first doped region far from the gate structure;

forming an initial electrical contact layer after the trench is formed, wherein the initial electrical contact layer fills up the trench, and the initial electrical contact layer is located on one side of the gate structure;

removing part of the initial electrical contact layer located on the sidewall of the gate structure, wherein the remaining part of the initial electrical contact layer is used as the electrical contact layer, and a sidewall of the electrical contact layer and the sidewall of the gate structure enclose a groove; and filling the groove, to form a second dielectric layer, wherein the first dielectric layer and the second dielectric layer constitute the dielectric layer.

* * * * *